United States Patent
Niimi et al.

(12)

(10) Patent No.: US 6,333,890 B1
(45) Date of Patent: Dec. 25, 2001

(54) MEMORY DEVICE WITH A PLURALITY OF COMMON DATA BUSES

(75) Inventors: Masahiro Niimi; Shinya Fujioka; Tadao Aikawa; Yasuharu Sato, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/695,302

(22) Filed: Oct. 25, 2000

(30) Foreign Application Priority Data

Nov. 2, 1999 (JP) .................................................. 11-312317

(51) Int. Cl.$^7$ ....................................................... G11C 8/00
(52) U.S. Cl. ................. 365/230.03; 365/63; 365/230.01; 365/233
(58) Field of Search ............................. 365/233, 230.03, 365/189.05, 203, 221, 239, 63, 230.01

(56) References Cited

U.S. PATENT DOCUMENTS

| | | | |
|---|---|---|---|
| 5,047,984 | * | 9/1991 | Monden ................................ 365/203 |
| 5,386,383 | * | 1/1995 | Raghavachari .................. 365/189.05 |
| 5,666,322 | * | 9/1997 | Conkle ................................. 365/233 |
| 5,991,223 | * | 11/1999 | Kozaru et al. .................... 365/230.03 |
| 6,016,282 | * | 1/2000 | Keeth .................................. 365/233 |
| 6,115,318 | * | 9/2000 | Keeth .................................. 365/233 |

* cited by examiner

*Primary Examiner*—David Nelms
*Assistant Examiner*—Gene N. Auduong
(74) *Attorney, Agent, or Firm*—Arent Fox Kintner Plotkin & Kahn, PLLC

(57) ABSTRACT

According to an aspect of the present invention, a memory device having a plurality of banks carries out bank interleaving by use of a plurality of common data buses, the number of which is less than the number of the banks. The present invention enables the data to be read more rapidly while suppressing the increase of the chip area. According to the present invention, there is provided a memory device having a plurality of banks each including a plurality of memory cells, and reading or writing data from or into the memory cells in synchronism with a clock signal, the memory device comprising: a sense amplifier disposed on each of the plurality of banks, for amplifying data read from the memory cells; a plurality of common data buses shared by the plurality of banks, the number of the common data buses being less than the number of the banks; and a switching circuit disposed on each of the plurality of banks, for feeding or receiving data of the each bank to or from the plurality of common data buses; wherein read or write of data of the plurality of banks is made through successive selection of the plurality of common data buses by the switching circuit.

7 Claims, 11 Drawing Sheets

MEMORY DEVICE WITH A PLURALITY OF COMMON DATA BUSES

BACKGROUND OF THE INVENTION

1. Field of the Invention

The present invention relates to a memory device such as a DRAM, and more particularly to a memory device having common data buses for a plurality of banks, to speedup the readout operations.

2. Description of the Related Art

Attention is being paid to synchronous dynamic RAMs (SDRAMS, FCRAMs (fast cycle RAMS), etc.) as high-speed dynamic RAMS. To further speed up data read, in such a dynamic RAM, the data read is performed through bank interleaving. The bank interleaving is a data read approach for reading data in a time-shared manner from a plurality of banks obtained as a result of segmentation of a memory area.

FIG. 1 is a configuration diagram of a memory device having a conventional bank configuration. The memory device shown in FIG. 1 has a memory area which is segmented into four banks Bank0 to Bank3, each provided with a plurality of memory cells, a word decoder, a column decoder, a sense amplifiers, etc.

The banks Bank0 to Bank3 are connected to global data buses GDB0 to GDB3 corresponding thereto, which in turn are connected via common data bus switching circuits CDBSW0 to CDBSW3 to a common data bus CDB shared by the four banks. The common data bus switching circuits CDBSW0 to CDBSW3 each include a transfer gate Trsf.A0 consisting of an N-type transistor and a P-type transistor that are connected to each other in parallel.

The output of the common data bus CDB is connected via a latched circuit 11 to a transfer gate Trsf.A1 which in turn is connected via a latched circuit 15 to a data input/output terminal DQ.

The synchronous memory device performs data read and write in synchronism with a clock signal. In order to read, after reading data from a bank, the next data from the same bank, however, the bank configured memory device has to stand by for at least the duration corresponding to the time from read of first data to the completion of read preparation for the next data, i.e., corresponding to the minimum operation cycle time tRC (RAS cycle time) of the sense amplifier. In case of tRC=3×tCLK memory device (tCLK is a clock cycle), for example, READ commands can be issued every third clock at most to read data from the same bank.

For this reason, with the memory area of the memory device segmented into a plurality of banks, the memory device data read operation can be sped up by effecting the bank interleaving for reading, for the duration when data are not to be read from a bank, data from another bank. This applies equally to the case of data write.

FIG. 2 is a timing chart obtained when the data are read by bank interleaving in the conventional memory device shown in FIG. 1. The memory device operates in synchronism with a clock signal CLK having a cycle tCLK, and the banks are fed with read commands RD0, RD1, etc in synchronism with the rise of the clock signal CLK. In case of successive feed of read commands RD0 to the same bank, e.g., the bank Bank0, the period equal to the minimum operation cycle tRC needs to be provided between the two commands RD0.

The banks provide respective data as their outputs to the global data buses GDB0, GDB1, etc., in response to read commands RD0, RD1, etc., and feed the respective data to the common data bus CDB in synchronism with the rise of a gate signal A0 from the transfer gate Trsf.A0. In this case, the cycle of the gate signal A0 from the transfer gate Trsf.A0 is equal to the cycle of the clock signal CLK so that the data of the common data bus CDB vary every cycle tCLK of the clock signal CLK.

Data output to the common data bus CDB are held in the latched circuit 11 and, in synchronism with the rise of a gate signal A1 of the transfer gate Trsf.A1, held in the latched circuit 15. The data held in the latched circuit 15 are then fed to the input/output terminal DQ.

In this manner, the conventional memory device is able to read each bank data into the common data bus CDB by bank interleaving, to feed the data to the input/output terminal DQ at the cycle tCLK equal to that of the clock signal CLK. The reverse operation is performed in case of data write into each bank.

When the conventional memory device thus reads data of a plurality of banks by interleaving and feeds the data to the input/output terminal DQ, the common data bus CDB iterates the level transition between the low and high levels at the cycle tCLK of the clock signal CLK.

In the event of highly integrated, e.g., 128-Mbit or 256-Mbit memory devices, however, the common data bus CDB tends to have an elongated in-chip wiring and therefore an increased wiring capacity. This results in an elongated rise and fall time of data read into the common data bus CDB, whereupon the thus read data may not correctly reach the input/output terminal DQ with the operation clock CLK in a high-frequency band.

On the contrary, provision of the common data bus on each of the plurality of banks enables the level transition cycles of the respective common data buses CDB to be delayed, so that the read data can correctly reach the input/output terminal DQ. As a result, however, the number of common data buses CDB comes up to (the number of banks) ×(the number of input/output terminals)

in the entire memory device, thus increasing the memory device chip area.

SUMMARY OF THE INVENTION

It is therefore the object of the present invention to provide a memory device capable of bank interleaving at a high-speed frequency band with use of as small a number of common data buses as possible.

According to an aspect of the present invention, in order to attain the above object, a memory device having a plurality of banks carries out bank interleaving by use of a plurality of common data buses, the number of which is less than the number of the banks. The present invention enables the data to be read more rapidly while suppressing the increase of the chip area.

According to another aspect of the present invention, in order to achieve the above object, there is provided a memory device having a plurality of banks each including a plurality of memory cells, and reading or writing data from or into the memory cells in synchronism with a clock signal, the memory device comprising: a plurality of common data buses shared by the plurality of banks, the number of the common data buses being less than the number of the banks; and switching circuits disposed on each of the plurality of banks, for feeding or receiving data of the each bank to or from the plurality of common data buses; wherein read or write of data of the plurality of banks is made through successive selection of the plurality of common data buses by the switching circuit.

According to the present invention, output or input of each bank data is made through the successive selection of the plurality of common data buses, whereby it is possible to delay the level transition cycle in a single common data bus. For this reason, the common data bus data can correctly be transmitted to the input/output terminal DQ even in case the common data bus has a large wiring capacity with elongated rise or fall time of level of the common data bus in the bank interleaving at a high-frequency band.

It is also possible to reduce the number of common data buses in the entire memory device by (n−m)×(the number of input/output terminals)

as compared with the case of provision of common data buses on a bank-to-bank basis, which will contribute to a higher integration of the memory device. (n: number of banks, m: number of data buses)

In a preferred form of the present invention, the number of the common data buses is equal to the number of commands provided in the minimum operation cycle of the sense amplifier.

According to the present invention, (the number of the common data buses×tCLK) is equal to the sense amplifier minimum operation cycle, with the result that the data transition interval of the common data buses becomes equal to the minimum operation cycle so that each bank data can most effectively be read out.

DESCRIPTION OF THE PREFERRED EMBODIMENTS

The present invention will now be described with reference to the accompanying drawings which illustrate preferred embodiments thereof. It will however be understood that the embodiments are not intended to limit the technical scope of the present invention.

Figure 1:
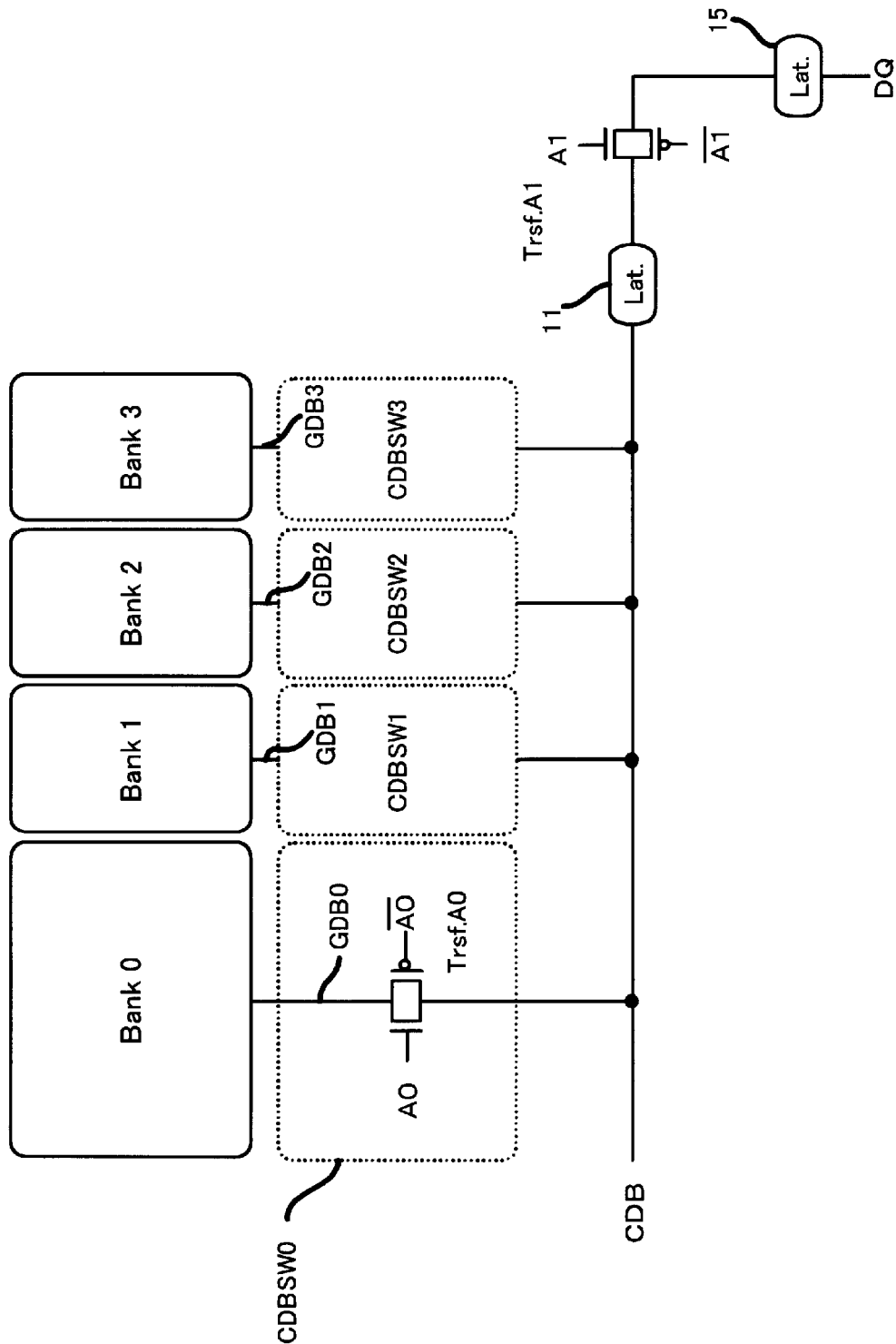
FIG. 1 illustrates a configuration of a conventional memory device.
Figure 2:
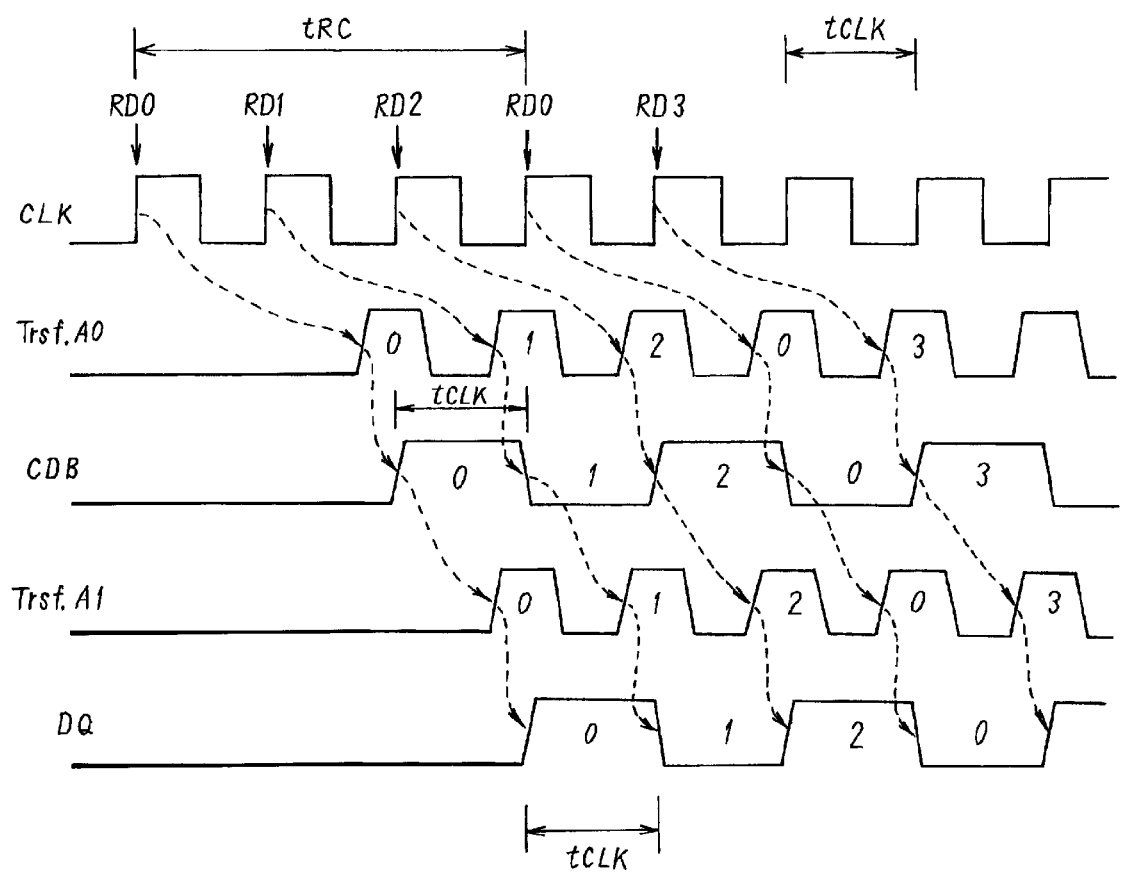
FIG. 2 is a timing chart of the conventional memory device.
Figure 3:
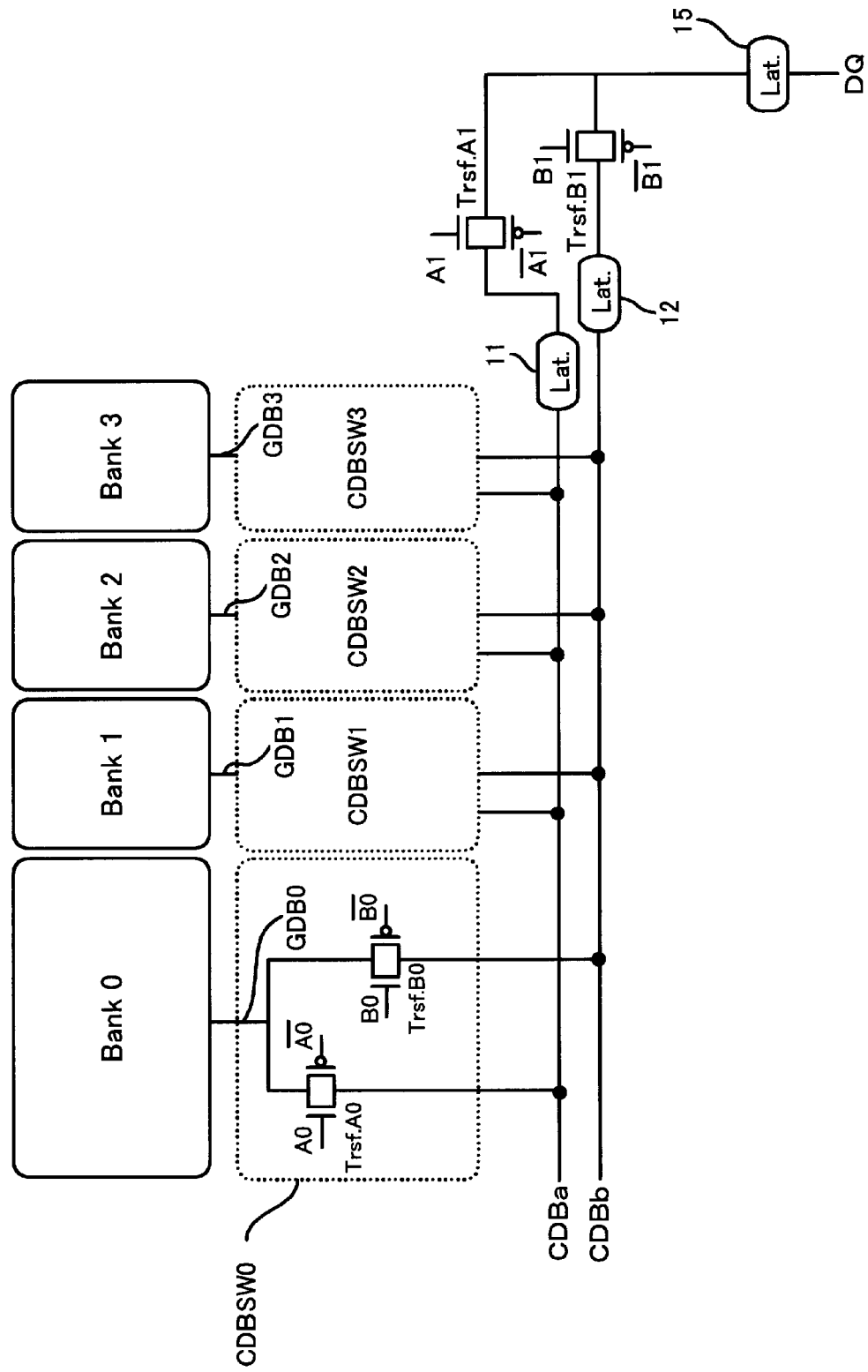
FIG. 3 is a configuration diagram (1) of a memory device in accordance with an embodiment of the present invention.

FIG. 3 is a configuration diagram of a memory device in accordance with a first embodiment. The memory device shown in FIG. 3 has a memory area which is divided into four banks Bank0 to Bank3, each of which is provided with a plurality of memory cells, a word decoder, a column decoder, a sense amplifier, etc., not shown. This embodiment includes two common data buses CDBa and CDBb, the number 2 of which is less than the number 4 of the banks.

The banks Bank0 to Bank3 are connected to corresponding global data buses GDB0 to GDB3, respectively. The global data buses GDB0 to GDB3 in turn are connected by common data bus switching circuits SCBSW0 to CDBSW3 to the common data buses CDBa and CDBb.

By way of transfer gates Trsf.A0 and Trsf.B0 each consisting of an N-type transistor and a P-type transistor that are connected to each other in parallel, the common data bus switching circuits CDBSW0 to CDBSW3 connect the global data buses GDB0 to GDB3 to the common data buses CDBa and CDBb.

The outputs of the common data buses CDBa and CDBb are connected via latched circuits 11 and 12 to transfer gates Trsf.A1 and Trsf.B1, respectively, which in turn are connected via a latched circuit 15 to a data input/output terminal DQ.

Figure 4:
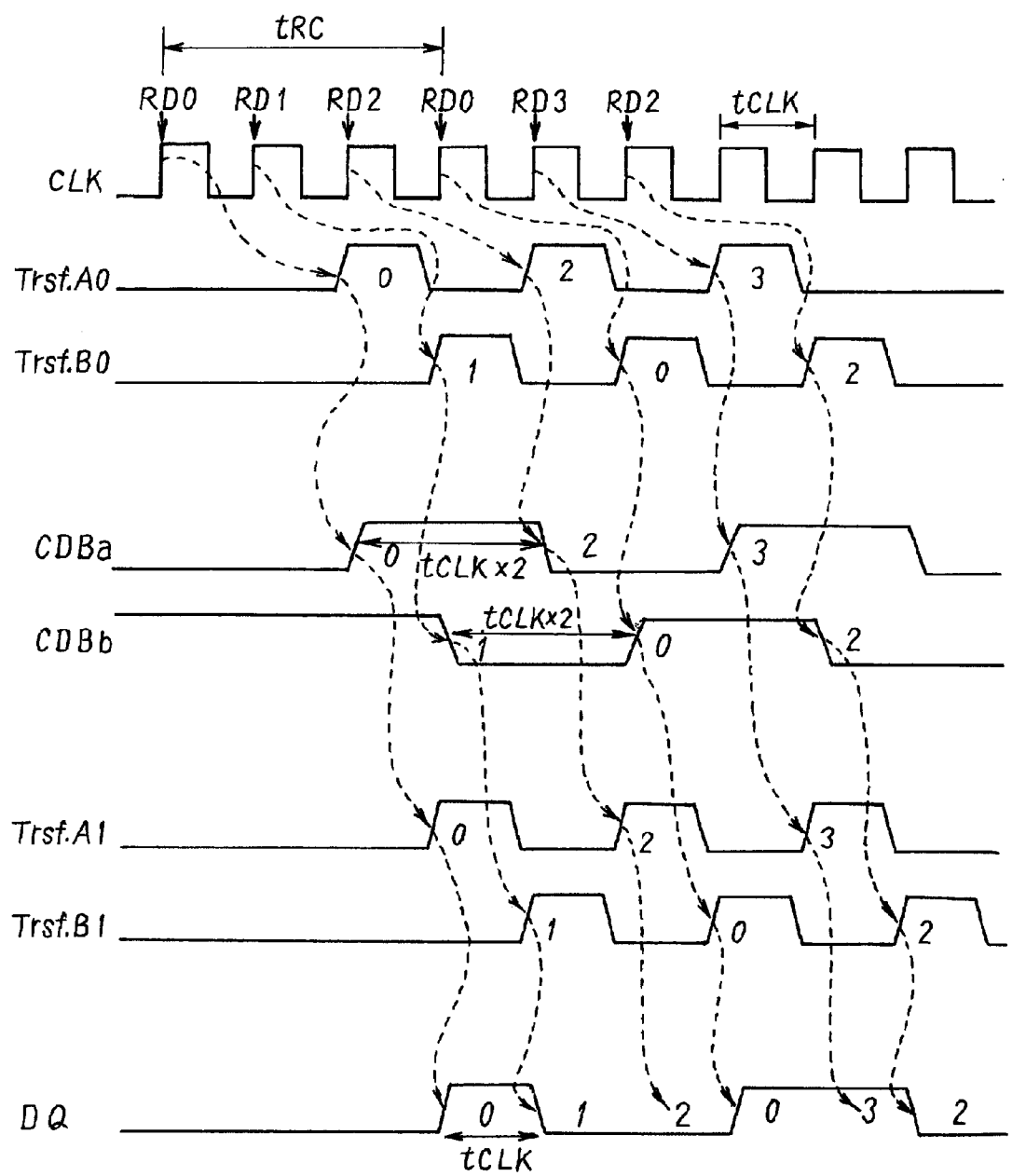
FIG. 4 is a timing chart of the memory device of FIG. 3.

FIG. 4 is a timing chart obtained when data are read by bank interleaving in the memory device of the first embodiment. The memory device of this embodiment operates in synchronism with a clock signal CLK having a cycle tCLK such that the banks are fed with read commands RD0, RD1, etc., in synchronism with the rise of clock signal CLK. In the event that the read command RD0 is fed to the same bank, e.g., the bank Rank0, there is a need to provide a period equal to the minimum operation cycle tRC of the sense amplifier between two read commands RD0, as hereinbefore described.

The bank Bank0 provides data as its output to the global data bus GDB0 in response to the read command RD0 and provides the data as its output to the first common data bus CDBa in synchronism with the rise of a gate signal A0 from the transfer gate Trsf.A0 in CDBSW0.

Similarly, the bank Bank1 provides data as its output to the global data bus GDB1 in response to the read command RD1 and provides the data as its output to the second common data bus CDBb in synchronism with the rise of a gate signal B0 from the transfer gate Trsf.B0 in CDBSW1.

Similarly, the bank Bank2 provides data as its output to the global data bus GDB2 in response to the read command RD2 and provides the data as its output to the first common data bus CDBa in synchronism with the rise of a gate signal A0 from the transfer gate Trsf.A0 in CDBSW2.

Similarly, a read command RD0 is fed to the bank Bank0. However the read command RD0 is fed with the lag equal to the sense amplifier minimum operation cycle tRC relative to the most recent read command RD0. The bank Bank0 provides data as its output to the global data bus GDB0 in response to a read command RD0 and provides the data as its output to the second common data bus CDBb in synchronism with the rise of a gate signal B0 from the transfer gate Trsf.B0 in CDBSW0. Afterward, in the same manner, data read from the banks are fed sequentially and alternately to the first and second common data buses CDBa and CDBb.

Data fed to the common data buses CDBa and CDBb are held in the latched circuits 11 and 12 and, in synchronism with the rise of gate signals A1 and B1 from the transfer gates Trsf.A1 and Trsf.B1, respectively, the data are transferred to and held in the latched circuit 15 acting as a data input/output circuit. Data held in the latched circuit 15 are ones obtained by serially converting the data of the first and second common data buses CDBa and CDBb. The data held in the latched circuit 15 are output to the input/output terminal DQ. Thus, the latched circuits 11 and 12 and the transfer gates Trsf.A1 and Trsf.B1 serve as data transfer circuits for serially transferring data of the first and second common data buses CDBa and CDBb to the latched circuit 15.

In this manner, the memory device of this embodiment allocates data read from the banks to the two common data buses CDBa and CDBb, so that the level transition cycle of a single common data bus CDBa, CDBb becomes double (tCLK×2) the prior art period.

This allows data of the common data buses CDBa and CDBb to correctly be transmitted to the input/output terminal DQ even though the common data buses CDBa and CDBb have an elongated data rise time or fall time with their wiring capacities increased. It is to be noted that the level transition cycle at the input/output terminal DQ becomes equal to the clock cycle tCLK so as not to impede the rapid data read.

The memory device of this embodiment is capable of bank interleaving by use of two common data buses for the four banks. It is therefore possible to reduce the number of common data buses in the entire memory buses by (4−2)×(the number of input/output terminals)

as compared with the case of provision of the common data bus on a bank-to-bank basis, which will contribute to a higher integration of the memory device.

Figure 5:
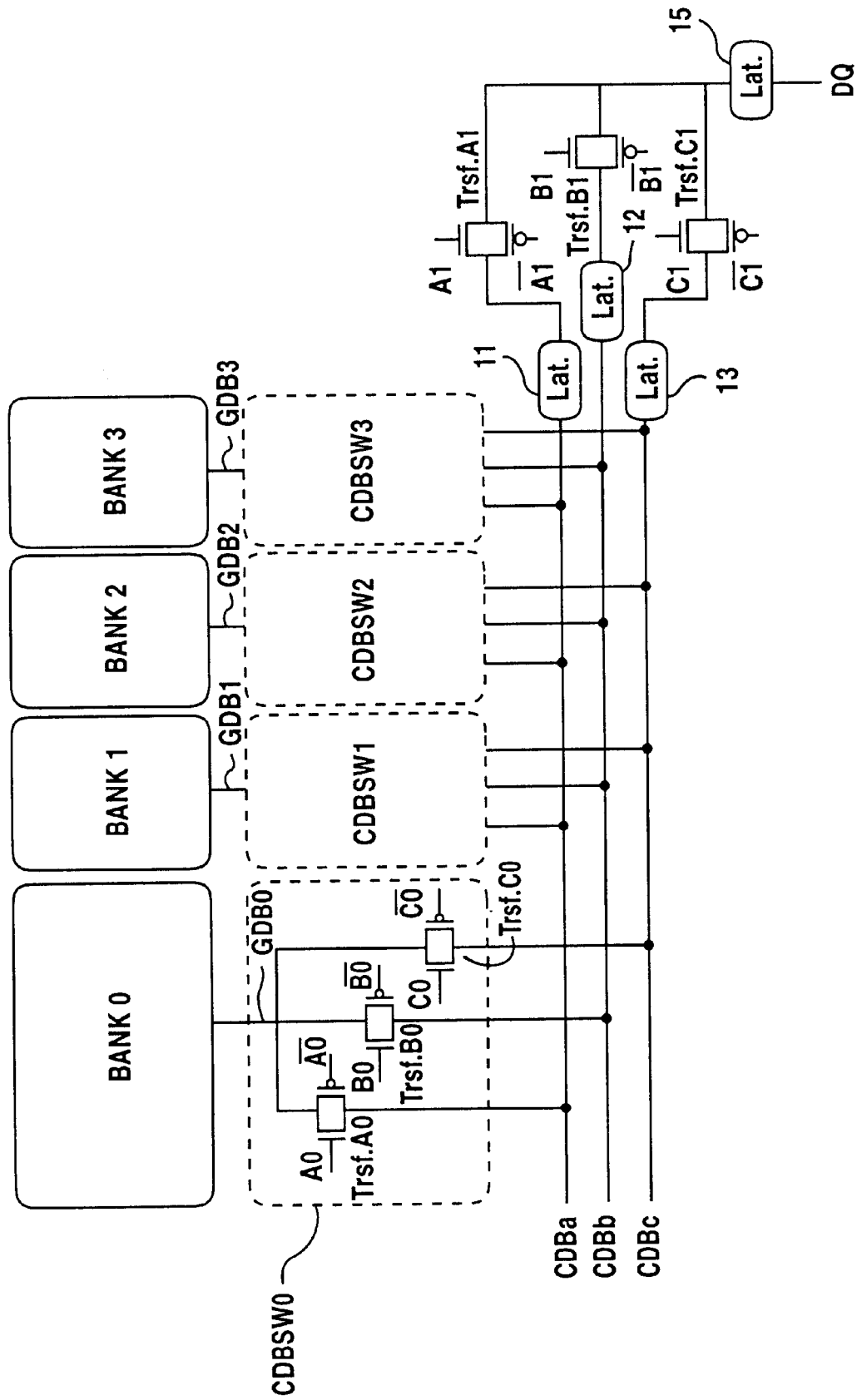
FIG. 5 is a configuration diagram (2) of the memory device in accordance with the embodiment of the present invention.

FIG. 5 illustrates a configuration of a memory device in accordance with a second embodiment. Similar to the first embodiment, the memory device depicted in FIG. 5 has a memory area which is divided into four banks Bank0 to Bank3, each of which includes a plurality of memory cells, a word decoder, a column decoder, a sense amplifier, etc., not shown. This embodiment employs three common data buses CDBa, CDBb and CDBc, the number 3 of which is less than the number 4 of the banks.

Since the memory device of this embodiment has the minimum operation cycle tRC equal to 3, when read commands are fed to the same bank, each bank data can most effectively be read with the number of the common data buses equal to 3.

The banks Bank0 to Bank3 are connected to corresponding global data buses GDB0 to GDB3, respectively. The global data buses GDB0 to GDB3 in turn are connected by common data bus switching circuits SCBSW0 to CDBSW3 to the common data buses CDBa, CDBb and CDBc.

By way of transfer gates Trsf.A0, Trsf.B0 and Trsf.C0 each consisting of an N-type transistor and a P-type transistor that are connected in parallel, the common data bus switching circuits CDBSW0 to CDBSW3 connect the global data buses GDB0 to GDB3 to the common data buses CDBa, CDBb and CDBc.

The outputs of the common data buses CDBa, CDBb and CDBc are connected via latched circuits 11, 12 and 13 to transfer gates Trsf.A1, Trsf.B1 and Trasf.C1, respectively, which in turn are connected via a latched circuit 15 to a data input/output terminal DQ.

Figure 6:
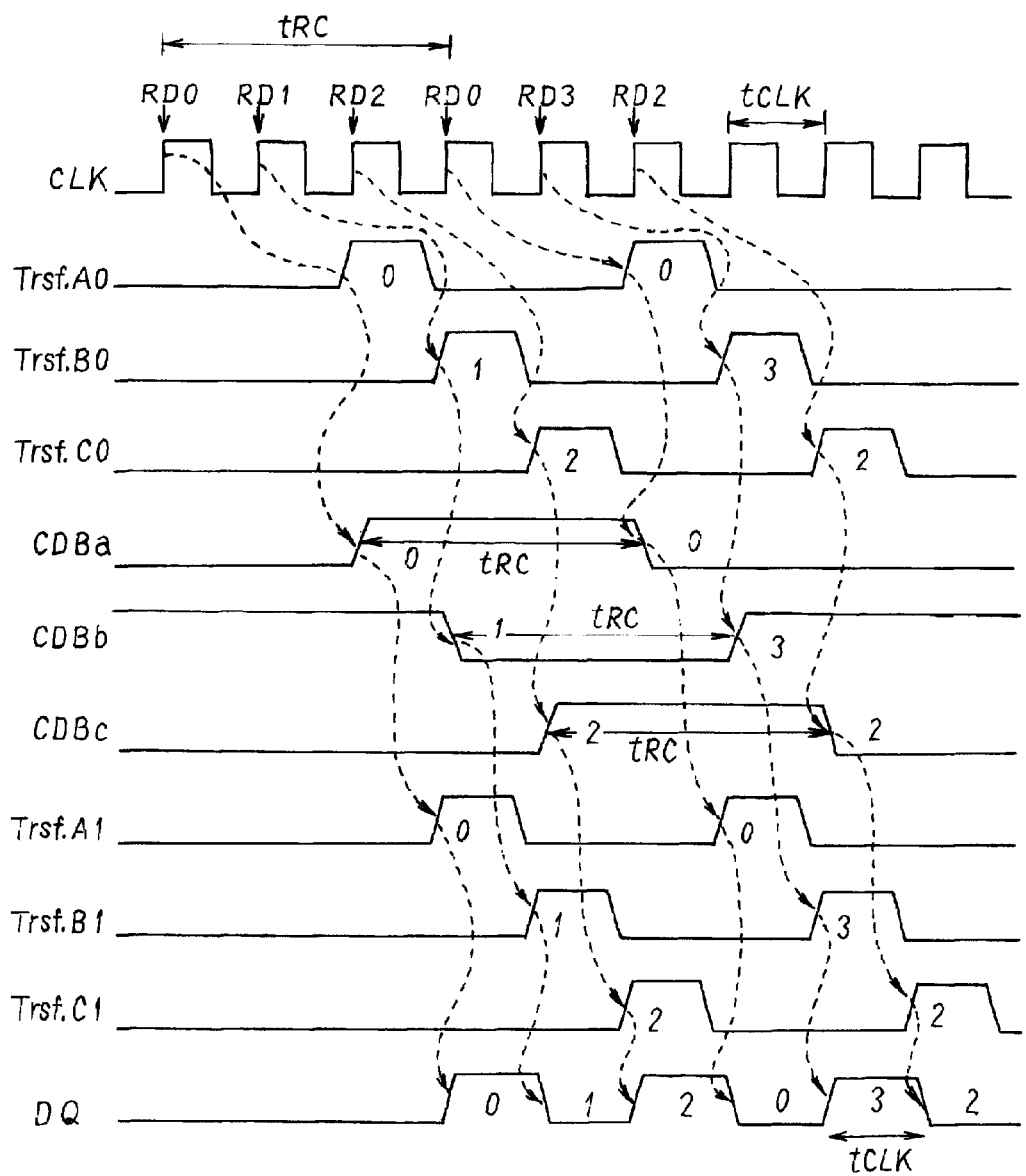
FIG. 6 is a timing chart of the memory device of FIG. 5.

FIG. 6 is a timing chart obtained when data are read by bank interleaving in the memory device of the second embodiment. Similar to the first embodiment, the memory device of this embodiment operates in synchronism with a clock signal CLK having a cycle tCLK such that the banks are fed with read commands RD0, RD1, etc., in synchronism with the rise of clock signal CLK. In the event that the read command RD0 is fed to the same bank, e.g., the bank Bank0, the feed is made with a lag equal to the minimum operation cycle tRC of the sense amplifier as hereinbefore described.

The bank Bank0 provides data as its output to the global data bus GDB0 in response to the read command RD0 and provides the data as its output to the first common data bus CDBa in synchronism with the rise of a gate signal A0 from the transfer gate Trsf.A0 in the common data bus switch CDBSW0.

In the same way, the bank Bank1 provides data as its output to the global data bus GDB1 in response to the read command RD1 and provides the data as its output to the second common data bus CDBb in synchronism with the rise of a gate signal B0 from the transfer gate Trsf.B0 in the common data bus switch CDBSW1.

Likewise, the bank Bank2 provides data as its output to the global data bus GDB2 in response to the read command RD2 and provides the data as its output to the third common data bus CDBc in synchronism with the rise of a gate signal C0 from the transfer gate Trsf.C0 in CDBSW2.

Likewise, after the elapse of the period equal to the minimum operation cycle tRC of the sense amplifier from the first read command RD0, the next command RD0 is fed to the bank Bank0. The bank Bank0 provides data as its output to the global data bus GDB0 in response to a read command RD0 and provides the data as its output to the first common data bus CDBa in synchronism with the rise of a gate signal A0 from the transfer gate Trsf.A0 in CDBSW0.

Likewise, the bank Bank3 provides data as its output to the global data bus GDB3 in response to the read command RD3 and provides the data as its output to the second common data bus CDBb in synchronism with the rise of a gate signal B0 from the transfer gate Trsf.B0 in CDBSW3.

Likewise, the bank Bank2 provides data as its output to the global data bus GDB2 in response to the read command RD2 and provides the data as its output to the third common data bus CDBc in synchronism with the rise of a gate signal C0 from the transfer gate Trsf.C0 in CDBSW2. Subsequently, in the same manner, data read from the banks are fed in succession to the three common data buses CDBa, CDBb and CDBc.

Data fed to the common data buses CDBa, CDBb and CDBc are held in the latched circuits 11, 12 and 13 respectively, and in synchronism with the rise of gate signals A1, B1 and C1 from the transfer gates Trsf.A1, Trsf.B1 and Trsf.C1, respectively, the data are transferred to and held in the latched circuit 15 acting as a data input/output circuit. The data held in the latched circuit 15 are ones obtained as a result of serial conversion of the data fed to the first, and second and third common data buses CDBa, CDBb and CDBc. The data held in the latched circuit 15 are output to the input/output terminal DQ. Thus, the latched circuits 11, 12 and 13 and the transfer gates Trsf.A1, Trsf.B1 and Trsf.C1 serve as data transfer circuits for serially transferring data of the first, second and third common data buses CDBa, CDBb and CDBc to the latched circuit 15.

In this way, the memory device of this embodiment allocates data read from the banks to the three common data buses CDBa, CDBb and CDBc, so that the level transition cycle of a single common data bus becomes treble (tCLK×3=tRC) the prior art period.

This enables the common data bus data to correctly be transmitted to the input/output terminal DQ even though the common data buses CDBa, CDBb and CDBc have an elongated data rise time or fall time with their wiring capacities increased. It is to be noted that the level transition cycle at the input/output terminal DQ becomes equal to the clock cycle tCLK so as not to impede the rapid data read.

The memory device of this embodiment is capable of bank interleaving by use of three common data buses for the four banks. It is therefore possible to reduce the number of common data buses in the entire memory buses by (4−3)×(the number of input/output terminals)

as compared with the case of provision of the common data bus on a bank-to-bank basis, which will contribute to the high-integration of the memory device.

Since the memory device of this embodiment has the sense amplifier minimum operation cycle tRC equal to 3, when read commands are fed to the same bank, each bank data can most effectively be read with the number of the common data buses equal to 3.

Figure 7:
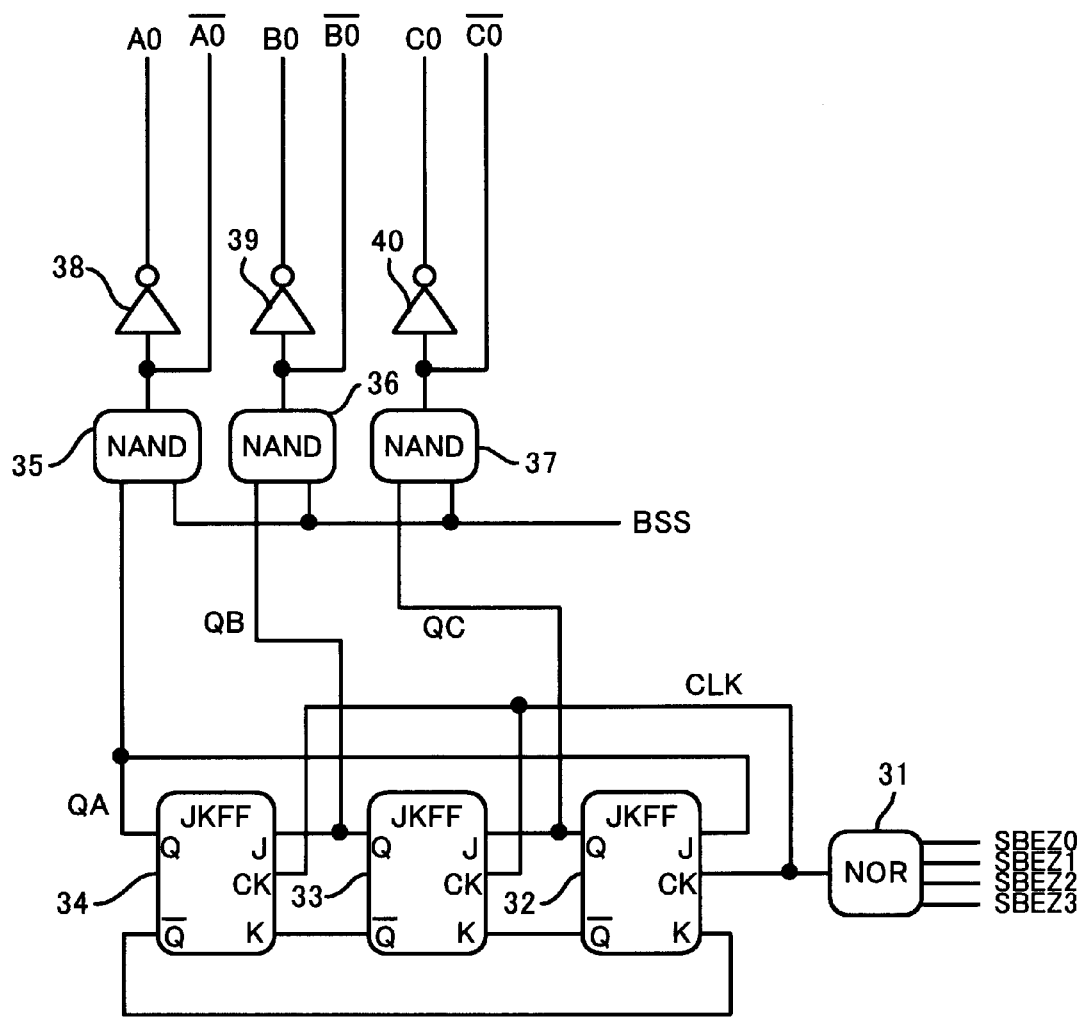
FIG. 7 illustrates a configuration of a 3-frequency-dividing circuit in accordance with an embodiment of the present invention.

FIG. 7 is a configuration diagram of a 3-frequency-dividing circuit for feeding gate signals A0,/A0, B0, /B0, C0 and /C0 to the transfer gates Trsf.A0, Trsf.B0 and Trsf.C0 of the memory device in accordance with the second embodiment depicted in FIG. 5. The 3-frequency-dividing circuit of this embodiment comprises a NOR circuit 31 which receives global data bus amplifier activation signals SBEZ0 to SBEZ3 to be fed to global data bus amplifiers GDBAmp which will be described later, JK flip-flops 32, 33 and 34 for 3-frequency-dividing the output of the NOR circuit 31, NAND circuits 35, 36 and 37 for feeding the thus 3-frequency-divided signals to the transfer gates Trsf.A0, trsf.B0 and Trsf.C0, and inverter circuits 38, 39 and 40.

The global data bus amplifier activation signals SBEZ0 to SBEZ3 fed from the banks are combined in the NOR circuit 31 into clock signals CLK having a cycle tCLK, which in turn are fed to CK terminals of the JK flip-flops 32, 33 and 34.

Each of the three JK flip-flops 32, 33 and 34 has a J terminal and a K terminal which are connected to a Q terminal and a /Q terminal of the adjacent JK flop-flop. Then, the Q terminal and /Q terminal of one of the JK flop-flops are previously set to (1, 0), respectively, with the Q terminals and /Q terminals of the other two JK flip-flops being reset to (0, 1), respectively. Hence, each time a clock signal CLK of cycle tCLK is fed to the CK terminal, the JK flip-flop whose Q terminal and /Q terminal result in (1, 0), respectively, shifts to the adjacent one in a cyclic manner to generate timing signals QA, QB and QC which are obtained by 3-frequency-dividing the clock signal CLK of cycle tCLK.

Together with bank selection signals BSS for selecting a bank from which data are read, the timing signals QA, QB and QC are fed to the NAND circuits 35, 36 and 37. The outputs of the NAND circuits 35, 36 and 37 are inverted by inverter circuits 38, 39 and 40, respectively, to generate the gate signals A0, /A0, B0, /B0, C0 and /C0 to be fed to the transfer gates Trsf.A0, Trsf.B0 and Trsf.C0.

In this manner, the 3-frequency-dividing circuit of this embodiment generates the gate signals A0, /A0, B0, /B0, C0 and /C0 fed to the transfer gates Trsf.A0, Trsf.B0, Trsf.C0 from the timing signals QA, QB and QC obtained by 3-frequency-dividing the clock signal CLK of cycle tCLK, thereby enabling the common data buses CDBa, CDBb and CDBc to be selected cyclically for read of each bank data.

Figure 8A:
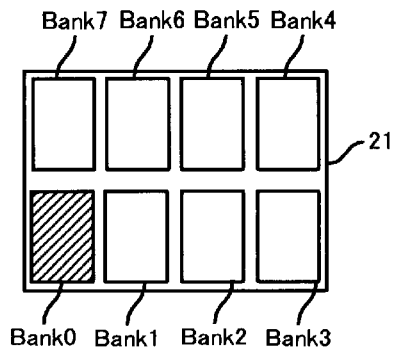
FIGS. 8A–8C illustrate a circuit arrangement of the memory device in accordance with the embodiment of the present invention.
Figure 8B:
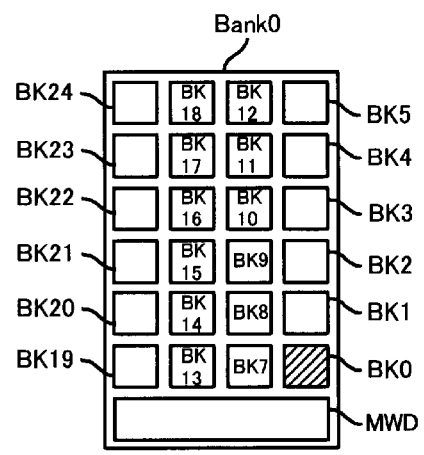

FIG. 8 is a diagram showing the circuit arrangement in cases where the memory device of this embodiment is comprised of, e.g., eight banks. As shown in FIG. 8A, the eight-bank memory device has a memory area which is divided into eight banks Bank0 to Bank7 in a chip 21. The memory area of each bank is subdivided such that the bank Bank0 is provided with a plurality of blocks BK0 to BK24, for example, and a main word decoder MWD as shown in FIG. 8B.

Figure 8C:
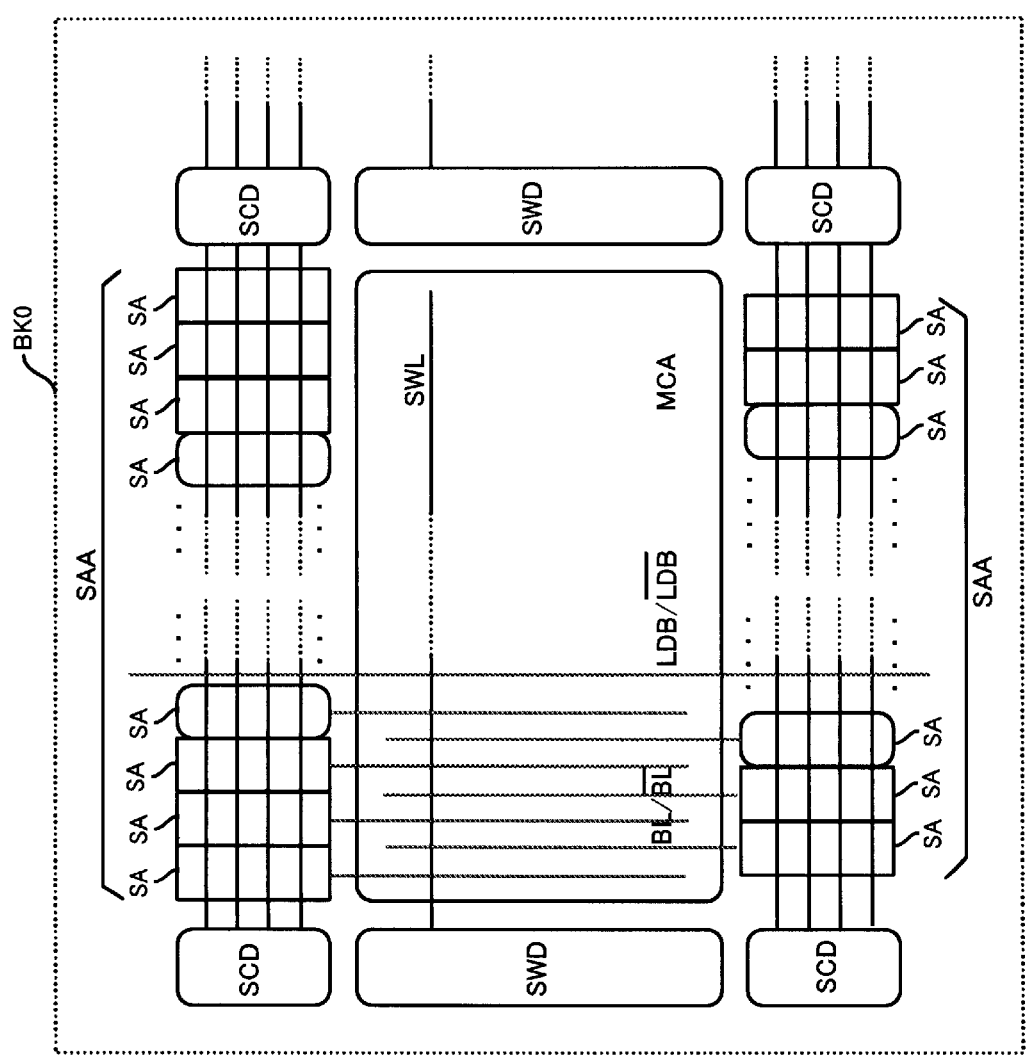

FIG. 8C is a configuration diagram depicting the block BK0 of FIG. 8B. As depicted in FIG. 8C, the block BK0 includes a memory cell array MCA having a plurality of memory cells (not shown), and a sense amplifier array SAA having a plurality of sense amplifier SA disposed on both sides of the memory cell array MCA.

In response to a column selection signal fed from a sub-column decoder SCD, the data read to a bit line pair BL and /BL amplified by the sense amplifier SA are provided to local data buses LDB and /LDB. Herein, the local data buses LDB and /LDB are a pair of data buses to which negative-phase signals are fed.

Sub-word decoders SWD are disposed on both sides of the memory cell array MCA. One of the sub-word decoders SWD is selected by the main word decoder MWD shown in FIG. 8B so that the thus selected sub-word decoder SWD drives a sub-word line SWL.

Figure 9:
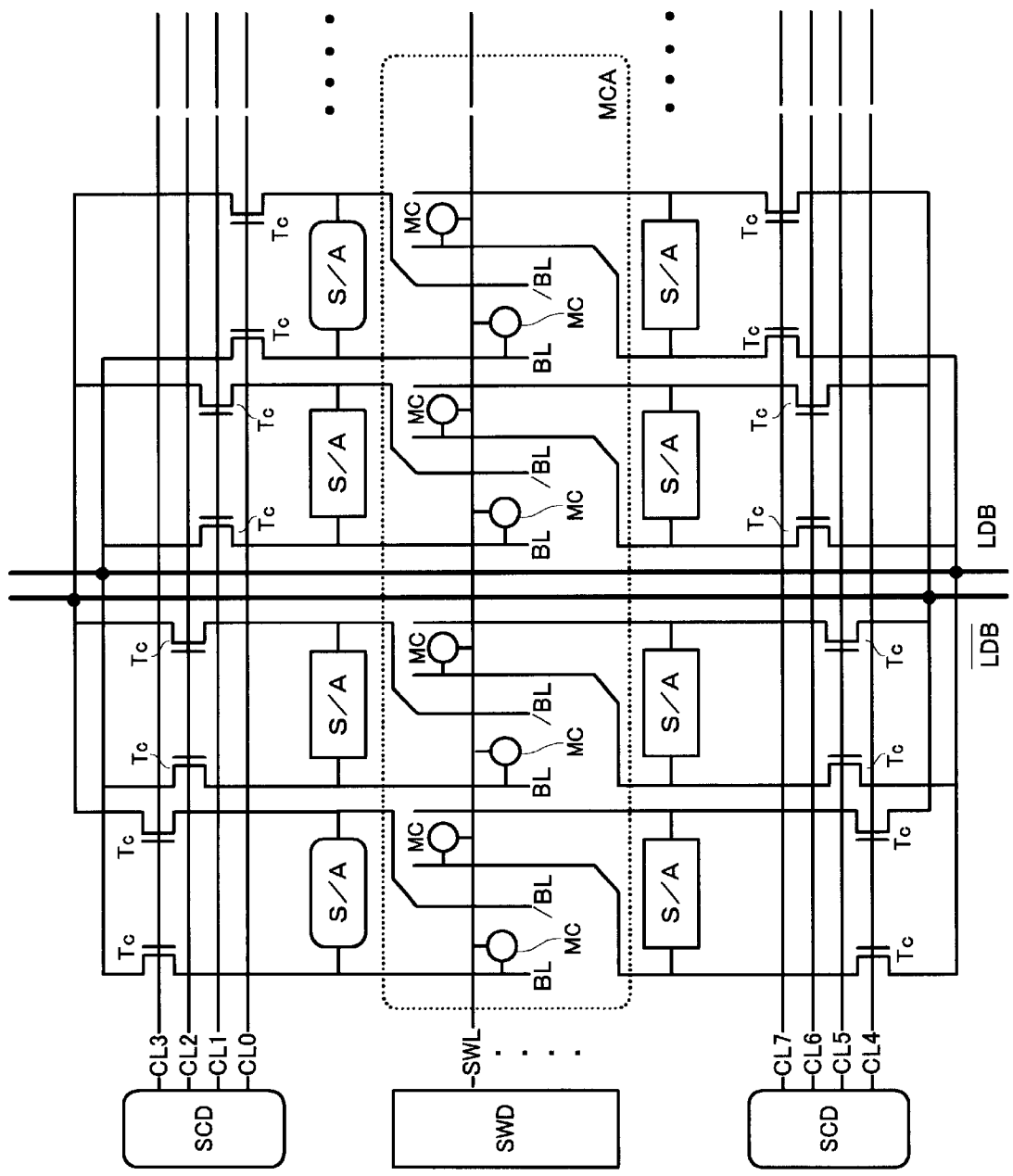
FIG. 9 shows a configuration of a memory cell array in accordance with an embodiment of the present invention.

Referring to FIG. 9, a further description will be made of the configuration of the block BK0 of FIG. 8C. As shown in FIG. 9, the memory cell array MCA includes therein a plurality of sub-word lines SWL driven by the sub-word decoder SWD, and a plurality of bit line pairs BL and /BL connected to the sense amplifier SA, with a memory cell being disposed at the intersection thereof, the memory cell consisting of a transistor and a capacitor (not shown).

The sub-column decoder SCD generates column selection signals CL0 to CL7. A column gate composed of a pair of transistors Tc become active by the column selection signals CL0 to CL7 and transfers to the local data buses LDB and /LDB the output of four sets of sense amplifiers SA which are arranged in two pairs in the bit direction.

Figure 10:
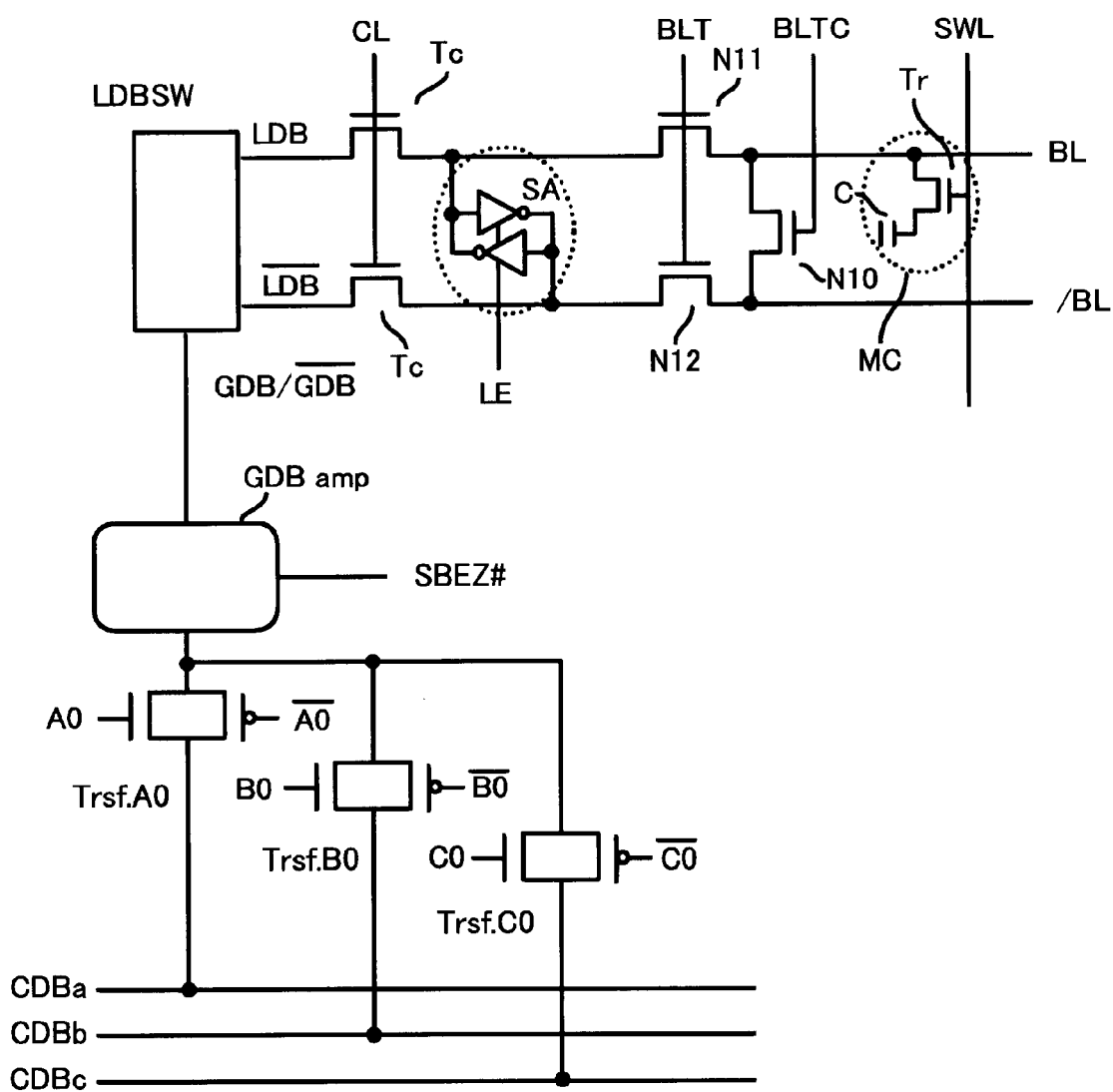
FIG. 10 shows a configuration of a memory cell in accordance with an embodiment of the present invention.

FIG. 10 is a diagram showing the relationship between the local data buses LDB, /LDB and the global data buses GDB, /GDB. Similar to the second embodiment, three common data buses CDB are herein provided.

As shown in FIG. 10, the bit line pair BL and /BL connected to the memory cell MC are connected via transistors N11 and N12 to the sense amplifier SA and further by way of the transistors Tc making up the column gate to the local data buses LDB and /LDB.

The local data buses LDB and /LDB are connected via the local data bus switching circuits LDBSW to the global data buses GDB and /GDB which in turn are connected to the global data bus amplifier GDBAmp that amplifies data transferred to the global data buses. Then, the global data bus amplifier GDBAmp is connected via the transfer gates Trsf.A0, Trsf.B0 and Trsf.C0 to the common data buses DCBa, CDBb and CDBc.

Description will then be made of the minimum operation cycle tRC of the sense amplifier in the case where data are read from each bank. In order to read data from each bank, the bit line pair BL and /BL are first pre-charged and a read command RD is fed to each bank. The sub-word line SWL is then driven and the sense amplifier SA is activated, after which the column gate Tc goes active so that data are output to the local data buses LDB and /LDB. Then, after the transfer of data of the local data buses LDB and /LDB to the global data buses GDB and /GDB, the bit line pair BL and /BL are pre-charged for the next read. Such a series of operation cycle steps form the minimum operation cycle RC of the sense amplifier.

More specifically, upon the input of a bit line short-circuit signal BLTC, the bit line pair BL and /BL are short-circuited into pre-charged level, after which upon the input of a bit line connection signal BLT to the transistors N11 and N12, they are placed in electrical connection with the sense amplifier SA.

When activated by a sense amplifier activation signal LE, the sense amplifier SA allows the bit line pair BL and /BL to go high or low depending on data of the memory cell MC. Data amplified by the sense amplifier SA are output to the local data buses LDB and /LDB by way of the transistor Tc which goes active by a column selection signal CL.

Data output to the local data buses LDB and /LDB are transferred via the local data bus switching circuit LDBSW to the global data buses GDB and /GDB and then are amplified by the global data bus amplifier GDBAmp which is activated by a global data bus amplifier activation signal SBEZ#. Herein, # of the global data bus amplifier activation signal SBEZ# indicates that it is a signal for each bank.

Figure 11:
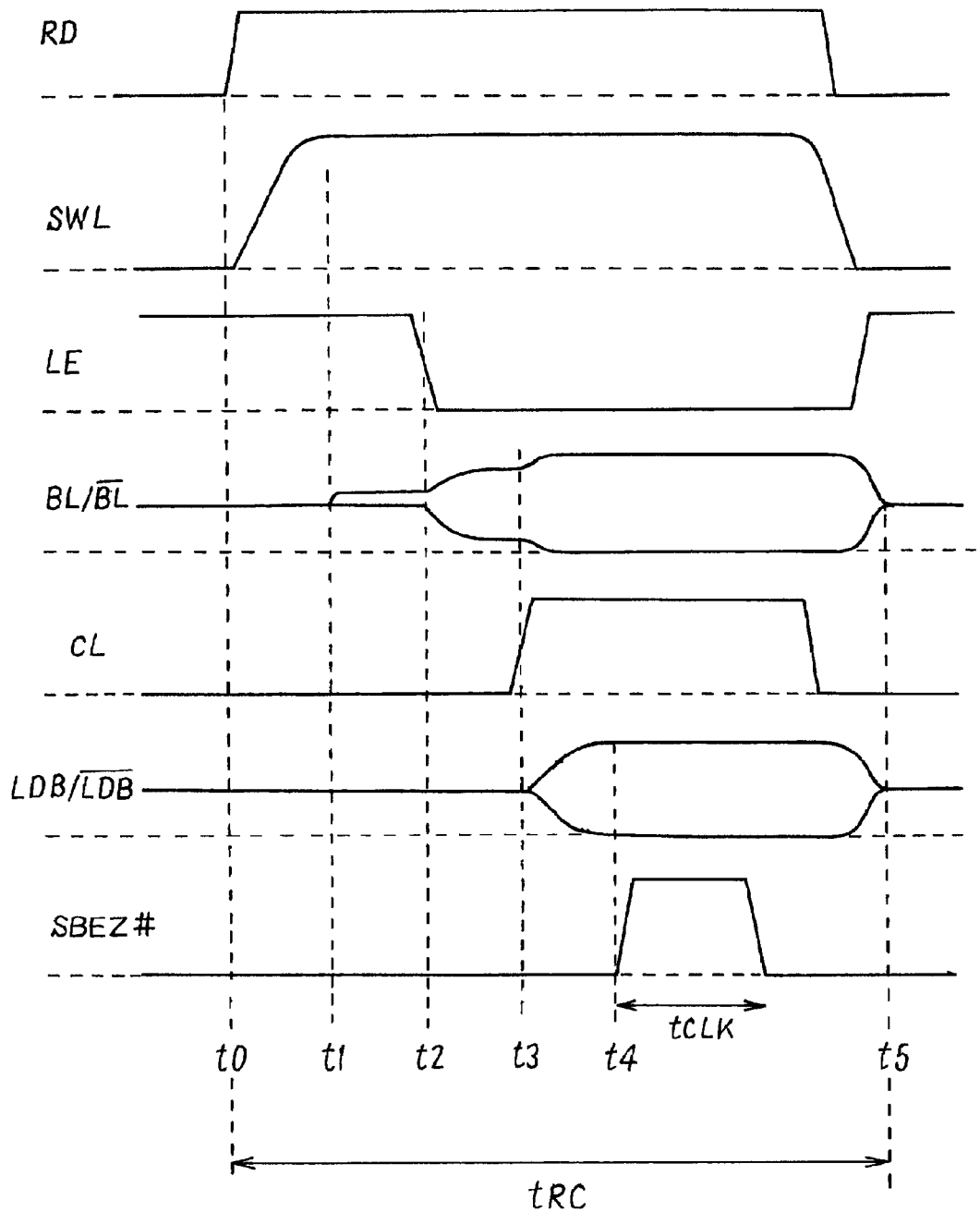
FIG. 11 is a timing chart of the memory cell in accordance with the embodiment of present invention.

FIG. 11 is a timing chart upon the data read of the memory cell of this embodiment. In case of data read, the sub-word line SWL is driven in response to a read command RD fed to each bank at time t0 so that the memory cell MC is placed in electrical connection with the bit line pair BL and /BL. The bit line pair BL and /B1 are in pre-charged level until the short-circuit is cancelled at time t1, with a potential difference corresponding to data of the memory cell MC starting to occur from the time t1.

The sense amplifier activation signal LE goes low at time t2, with the result that the sense amplifier SA is activated to amplify the potential difference between the bit line pair BL and /BL. Then, at time t3, a column selection signal CL is fed to the column gate transistor Tc so as to allow the bit line pair BL and /BL to connect to the local data buses LDB and /LDB. Thus, the local data buses LDB and /LDB are driven so that one goes high but the other goes low.

Then, at time t4, the global data bus amplifier GDBAmp is fed with a global data bus amplifier activation signal SBEZ# so that data of the global data buses GDB and /GDB are amplified and output via the transfer gates Trsf.A0, Trsf.B0 and Trsf.C0 to the common data buses CDBa, CDBb and CDBC, respectively.

Afterwards, the bit line pair BL and /BL are returned to pre-charged level at time t5 to complete the preparation for the next data read. That is, the minimum operation cycle tRC of the sense amplifier is the period from the time t0 when the read command RD is fed to the time t5 when the bit line pair BL and /BL are returned to the pre-charged level.

In this manner, each bank data read necessitates the period of the sense amplifier minimum operation cycle tRC and hence for the period during which data are not to be read from the same bank, data are read in sequence from the other banks whereby each bank data can effectively be read.

According to the present invention, each bank data output or input is made through the successive selection of a plurality of common data buses, so that it is possible to delay the level transition cycle in a single common data bus. For this reason, the common data bus data can correctly be transmitted to the input/output terminal even in case the common data bus has a large wiring capacity with elongated rise or fall time of data of the common data bus in the bank interleaving at a high-frequency band.

It is also possible to reduce the number of common data buses in the entire memory device to a great extent as compared with the case of provision of common data buses on a bank-to-bank basis, which will contribute to a higher integration of the memory device.

The scope of the protection for the present invention is not limited to the above embodiments and covers the inventions defined by the appended claims and equivalents thereof.

What is claimed is:

1. A memory device having a plurality of banks each including a plurality of memory cells, for reading or writing data from or into memory cells, said memory device comprising:
    a plurality of banks, each of said plurality of banks including a plurality of memory cells and a global data bus through which said data is read out of or written into the memory cells;
    a plurality of common data buses shared by said plurality of banks, the number of said common data buses being less than the number of said banks; and
    a plurality of switching circuits provided for each of said plurality of banks, for feeding or receiving data of each of said plurality of banks to or from said plurality of common data buses, one of said plurality of switching circuits being provided between each global data bus and the plurality of common data buses for selectively connecting each global data bus with one of the plurality of common data buses; wherein
    read or write operations of data of said plurality of banks are made by cyclically switching said switching circuits so that the global data buses of selected banks are connected to each of the plurality of common data buses in a cyclic fashion.

2. The memory device according to claim 1, further comprising:
    a sense amplifier, provided for each of said plurality of banks, for amplifying data read from said memory cells and supplying the data to the global data bus of the bank;
    wherein the number of said common data buses is equal to the number of commands capable of being provided in a minimum operation cycle of said sense amplifier.

3. The memory device according to claim 1, wherein even when the memory banks are selected randomly, said switching circuit makes a cyclic selection of said plurality of common data buses so that read or write of data of said plurality of banks are performed.

4. The memory device according to claim 3, further comprising:
    a sense amplifier provided for each of said plurality of banks, for amplifying data read from said memory cells and supplying the data to the global data bus of the bank;
    wherein each of said plurality of banks has a bus amplifier for amplifying data detected by said sense amplifier and feeding them to said common data buses, and
    wherein said switching circuit makes a cyclic selection of said plurality of common data buses in response to a timing signal obtained by frequency dividing an activation signal of said bus amplifier with a frequency-dividing ratio equal to the number of said common data buses.

5. The memory device according to claim 1, further comprising:
    a data input/output circuit commonly provided to the plurality of common data buses; and
    a plurality of data transfer circuits provided for each common data bus, for cyclically transferring data of said plurality of common data buses to said data input/output circuit, said data transfer circuit performing said serial transfer in synchronism with said clock signal.

6. A memory device for reading or writing data from or into memory cells, said memory device comprising:

a plurality of banks, each of said plurality of banks including a plurality of memory cells and a global data bus through which said data of the memory cells is read out or written in, a plurality of common data buses shared by said plurality of banks, the number of said common data buses being less than the number of said banks; and switching circuits provided between each global data bus of each of said plurality of banks and the plurality of common data buses;

wherein read or write operations of data of said plurality of banks are made by cyclically switching said switching circuits in selected banks so that the global data buses of the selected banks are connected to the common data buses in a cyclic fashion.

7. The memory device according to claim 6, further comprising:

sense amplifiers for amplifying data read from said memory cells, wherein N number of commands are capable of being provided in a minimum operation cycle of said sense amplifier, and the number of the common data buses is equal to N.

* * * * *